US008194886B2

(12) United States Patent
Knight et al.

(10) Patent No.: US 8,194,886 B2
(45) Date of Patent: Jun. 5, 2012

(54) AUDIO CROSSOVER SYSTEM AND METHOD

(76) Inventors: Ian Howa Knight, Leicester (GB); Anthony Richard Milat, Sarasota, FL (US); Kym Martinelli, Sarasota, FL (US); Giles Garwell Smith, Leicester (GB)

( * ) Notice: Subject to any disclaimer, the term of this patent is extended or adjusted under 35 U.S.C. 154(b) by 1168 days.

(21) Appl. No.: 11/539,210

(22) Filed: Oct. 6, 2006

(65) Prior Publication Data

US 2007/0104336 A1 May 10, 2007

Related U.S. Application Data

(60) Provisional application No. 60/724,828, filed on Oct. 7, 2005.

(51) Int. Cl.
*H03G 5/00* (2006.01)

(52) U.S. Cl. .......................................... 381/99; 381/98

(58) Field of Classification Search ............. 381/98-99, 381/101, 11, 116
See application file for complete search history.

(56) References Cited

U.S. PATENT DOCUMENTS

| | | | |
|---|---|---|---|
| 3,646,270 | A | 2/1972 | Shiga et al. |
| 3,657,480 | A | 4/1972 | Cheng et al. |
| 3,838,215 | A | 9/1974 | Haynes, Jr. |
| 3,895,193 | A | 7/1975 | Bobb |
| 3,909,531 | A | 9/1975 | Plummer |
| 3,927,261 | A | 12/1975 | Dahlquist |
| 4,015,089 | A | 3/1977 | Ishii et al. |
| 4,031,318 | A | 6/1977 | Pitre |
| 4,031,321 | A | 6/1977 | Bakgaard |
| 4,074,070 | A | 2/1978 | Gaus |
| 4,138,594 | A | 2/1979 | Klipsch |
| 4,198,540 | A | 4/1980 | Cizek |
| 4,229,619 | A | 10/1980 | Takahashi et al. |
| 4,237,340 | A | 12/1980 | Klipsch |
| 4,243,840 | A | 1/1981 | Kates |
| 4,282,402 | A | 8/1981 | Liontonia |
| 4,295,006 | A | 10/1981 | Tanaka et al. |
| 4,315,102 | A | 2/1982 | Eberbach |
| 4,349,697 | A | 9/1982 | Skabla |
| RE31,228 | E | 5/1983 | Bose |
| 4,423,289 | A | 12/1983 | Swinbanks |
| 4,429,181 | A | 1/1984 | Freadman |
| 4,475,233 | A | 10/1984 | Watkins |
| 4,504,704 | A | 3/1985 | Ohyaba et al. |
| 4,593,405 | A | 6/1986 | Frye et al. |
| 4,597,100 | A | 6/1986 | Grodinsky et al. |
| 4,606,071 | A | 8/1986 | White, Jr. |
| 4,653,103 | A | 3/1987 | Mori et al. |
| 4,769,848 | A | 9/1988 | Eberbach |
| 4,771,466 | A * | 9/1988 | Modafferi ...................... 381/99 |

(Continued)

OTHER PUBLICATIONS

Paul Horowitz and Winfield Hill, The Art of Electronics, pp. 35-39, Cambridge University Press.

*Primary Examiner* — Devona Faulk
*Assistant Examiner* — Disler Paul
(74) *Attorney, Agent, or Firm* — Dickinson Wright PLLC

(57) ABSTRACT

An audio crossover system and method is disclosed. An audio system includes two driver circuits, one for each of two audio frequency ranges, e.g., high and low frequency ranges. The driver circuits are designed to provide a combined frequency response curve that has a pronounced midrange attenuation dip, in contrast to prior art designs that attempt to provide a flat response over all frequency ranges.

20 Claims, 2 Drawing Sheets

U.S. PATENT DOCUMENTS

| | | | | |
|---|---|---|---|---|
| 4,897,879 | A | 1/1990 | Geluk | |
| 5,153,915 | A | 10/1992 | Farella | |
| 5,297,212 | A | 3/1994 | Murayama et al. | |
| 5,533,135 | A | 7/1996 | Gary | |
| 5,568,560 | A | 10/1996 | Combest | |
| 5,598,480 | A | 1/1997 | Kim | |
| 5,642,429 | A | 6/1997 | Janssen | |
| 5,781,642 | A | 7/1998 | Tanaka et al. | |
| 5,937,072 | A | 8/1999 | Combest | |
| 6,281,749 | B1 | 8/2001 | Klayman et al. | |
| 6,381,334 | B1 | 4/2002 | Alexander | |
| 6,854,005 | B2 | 2/2005 | Thiele | |
| 7,085,389 | B1 * | 8/2006 | Modafferi | 381/99 |
| 2004/0122540 | A1 | 6/2004 | Allred | |
| 2004/0258256 | A1 | 12/2004 | Ruff | |
| 2005/0063554 | A1 | 3/2005 | Devantier et al. | |

* cited by examiner

AUDIO CROSSOVER SYSTEM AND METHOD

RELATED APPLICATIONS

This application claims the benefit of U.S. Provisional Application Ser. No. 60/724,828, filed Oct. 7, 2005, the entire disclosure of this application being considered part of the disclosure of this application and hereby incorporated by reference.

BACKGROUND OF THE INVENTION

1. Field of the Invention

The subject invention provides an audio crossover system and method.

2. Description of the Prior Art

The way humans hear sounds is complex. The auditory canal within the human ear is a long tube and it possesses resonances and peaks at certain frequencies. The lowest resonance is broadly peaked around 3 kHz and appreciable gains are incident from about 2 kHz to 6 kHz.

This frequency range that is accentuated by human hearing coincides with the frequency range in which important lingual sounds have their major spectral contents. Sounds like "p" and "t" have very important parts of their spectral energy within the "accentuated" range, making them easier to discriminate between. To hear sounds in the accentuated range is vital for speech communication.

When exposed to an incident directional sound field and including diffractive effects of the head, the maximum sound pressure level (SPL) at the eardrum can be approximately 7 dB to 20 dB higher than in the incident field, depending on the direction of the sound. In effect this gives humans a sensitivity increase within the range from around 2 kHz to 6 kHz of between 7 dB and 20 dB.

Because of this sensitivity, a flat frequency response in the 2 kHz to 6 kHz area, which is directly within the midrange crossover area, is not required. This sensitivity is illustrated in the Fletcher Munson curves as shown in FIGS. 1 and 2. If the curves of FIG. 1 are turned upside down, as in FIG. 2, they provide an indication of how the human hearing attenuates and accentuates parts of the audible frequency range.

Typical industry standard crossover designs do not take this human hearing sensitivity into consideration and, therefore, attempt to provide a flat response within this area. The subject invention, in contrast to the typical industry standard flat response design, provides a response that is inversely proportional to the increased sensitivity. This inversely proportional design will indicate a dip in response within the critical area when measured on a spectrum analyzer.

SUMMARY OF THE INVENTION AND ADVANTAGES

The crossover system and method of the present invention provides numerous advantages over the prior art.

The subject invention significantly lowers audible distortion in the midrange frequency area. The most evident distortion in multi-way speaker designs is predominantly located in the midrange area. The system of the present invention interacts with drivers to provide superior midrange clarity and a more natural reproduction with minimal distortion.

The subject invention provides significantly less coloration of signal. Due to the properties of the design, signal coloration caused by interaction of drivers, often attributed to box design, is minimized such that reproduction is both more natural and life-like.

The subject invention has a wider dynamic range. Due to several beneficial design properties, which become evident as a result of the application of the design, system performance as a whole is increased and allows the system to experience a fuller and more dynamic signal range.

The subject invention allows for very low listener fatigue due to lower distortion. Due to the lack of distortion inherent in the design, the brain does not need to filter unnecessary noise and information present in most speaker systems. The brain only has to process a faithful reproduction of the original signal, which ultimately causes less listening fatigue for the listener.

The subject invention provides increased signal to noise ratio. Trying to process distortion along with the signal causes the hearing system to produce its own noise; this manifests itself as a Hash Distortion within the ear. As a result of the distortion not being present, the signal to noise ratio is perceived as wider to the listener.

The subject invention improves amplifier performance. The amplifier is able to exert more control over the drivers due to the relationship between the speaker and the amplifier when used with the design. This results in an overall lowering of system artifacts and maximizes the potential and performance of even an entry level amplifier.

The subject invention provides rock solid stereo images and sound staging. Speakers disappear and provide a more complete stereo illusion, with excellent sound-staging depth resolution and precision image accuracy to a level not previously definable by the average listener.

The subject invention improves dispersion characteristics. Regardless of cabinet size, the speakers provide a presentation that portrays the scale of the recording more faithfully than traditional designs, such that large recordings will retain their size even on small cabinets.

The subject invention provides a universal design applicable to all standard multi-driver designs. Designs can be applied to 2-way, 3-way, 4-way, 5-way and other designs of speakers in any configuration regardless of driver type.

The subject invention will lower manufacturing costs. No additional special tooling or processes are required to implement the designs and no exotic or precision components are needed with the subject invention, which results in significantly lower manufacturing costs than with traditional crossover designs.

The subject invention lowers R&D costs. The designs can be implemented into existing speaker designs and configurations with minimal R&D expense and R&D can be focused on very specific areas for future development.

Furthermore, the subject invention follows a unique methodology and have applications in home hi-fi, professional monitors, cinema systems, live sound, commercial sound and car audio. The process can provide fresh new concepts in an established market that, to date, has provided few true innovations.

Although the designs of the subject invention were primarily developed for passive speakers, the principles can be applied to active configurations. Active systems can be infinitely tuned and are variable by nature to achieve any desired result. However, utilizing our design principles, active systems may be tuned with phenomenal results, results which have not been seen or heard by anyone else in the industry in systems tuned in this manner.

BRIEF DESCRIPTION OF THE DRAWINGS

Other advantages of the present invention will be readily appreciated, as the same becomes better understood by reference to the following detailed description when considered in connection with the accompanying drawings wherein.

DETAILED DESCRIPTION OF THE INVENTION

Figure 1:
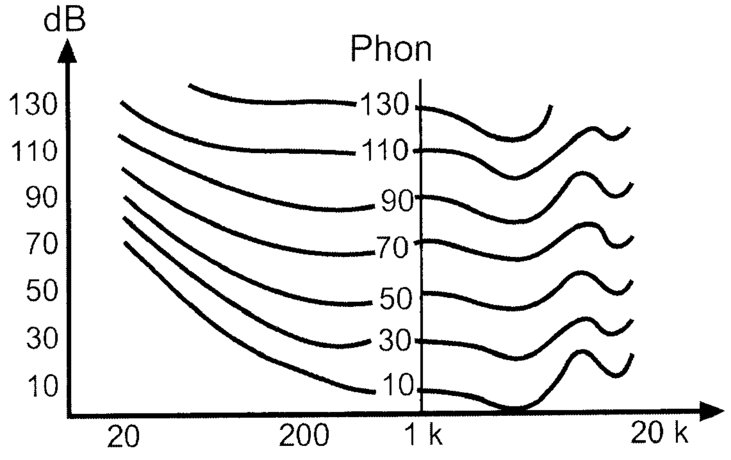
FIG. 1 is a graph showing Fletcher-Munson loudness curves.
Figure 2:
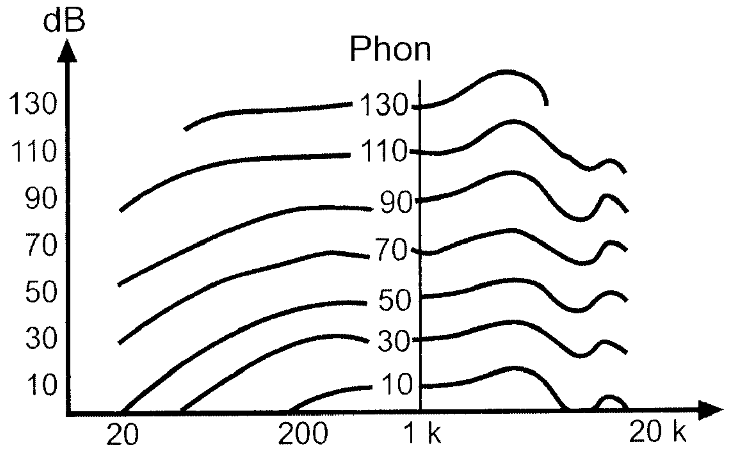
FIG. 2 is a graph showing inverted Fletcher-Munson loudness curves.

Referring to the Figures, wherein like numerals indicate corresponding parts throughout the several views, an audio crossover system and method is described herein.

All loudspeaker drivers have extreme mechanical limitations in their operation. Once these limits are reached, the driver will exhibit some form of mechanical breakup. When this mechanical breakup occurs, the movement of the driver becomes distorted, i.e., the driver no longer moves in an ideal pistonic motion.

When drivers are used close to their mechanical limits, they excite the inherent mechanical break-up properties, which are present in all drivers. Thus, there will be no chance of integrating it well with other drivers. The driver will produce distortion, and the energy present will not give the driver a chance to faithfully or accurately reproduce the audio signal given to it.

The crossover system of the subject invention is a true first order crossover in its operation and has the following characteristics:

1. CORRECT PHASE AND AMPLITUDE
2. MAXIMUM CONTROL OF AMPLIFIER OVER DRIVE UNIT
3. LOWEST DISTORTION POSSIBLE—EITHER PASSIVE OR ACTIVE
4. PISTONIC BEHAVIOR OF DRIVE UNITS

Unlike many commercial designs, the system of the subject invention needs no Zobel impedance correction or other types of correction circuits such as Notch Filters, Resonant Traps, etc.

The smoothness of frequency response and integration is achieved by the novel design, the correct usage of the drive units employed, and the correct implementation of first order crossover slopes.

Conventional thinking and industry standard application in conjunction with accepted trade-offs using first order crossovers actually prevent the most effective use of the first order crossovers. The usual and commonly accepted practice of the "butting up" of drivers (in terms of frequency response) actually prevents first order crossovers being used effectively, and thus getting the desired benefits from their use.

General convention dictates that because of the slow 6 dB/octave slope and also because designers feel obliged to "butt up" the frequencies of each individual driver and consequently the drivers are in a situation where they are being used or pushed in well into the breakup zone. This in turn negates any of the benefits of using first order slopes.

First order usage should expose the inherent benefits of the design, clearly revealing the best transient behavior from both the speaker and the amplifier. This results in giving maximum control over to the amplifier, which increases power handling due to cleaner absolute control of the amplifier over the driver.

Using conventional thinking and methods, the crossover frequency applied to the bass/midrange drivers in a two-way design is too high. This crossover point is typically around 2 kHz to 6 kHz. With the crossover point so high for the bass driver, the bass driver is excited in the less-than-ideal region near its mechanical limits and exhibits roughness/breakup, which in turn prevents optimal integration with the tweeter.

When this (breakup) area is being excited, the driver passes back (feeds) the amplifier this energy/distortion on return. Then the amplifier attempts to control it and grip it. The result is the energy within the system (amplifier and speakers) is in oscillation, more commonly referred to as distortion.

As the crossover frequency is lowered and the useable area is moved away from the mechanical limits of the driver, the roughness disappears and the bass/midrange driver starts to be more linear in its behavior and response to the signal applied to it.

This smooth response occurs because of a combination of several factors:

1. the bass/midrange is behaving more like a piston;
2. the amplifier is being fed less distortion back from the speaker; and
3. because of the above, the amplifier is producing less distortion and this occurrence allows a beating with the signal to begin. This beating is in phase and harmony with the signal and not fighting it.

The high frequency driver (tweeter) is dealt with in quite the same way as the mid/bass driver. The only difference is that the lower end of its frequency response is limited. The breakup frequencies with which a designer should be concerned start as the signal approaches the driver's resonance frequency, or Fs. Again, general convention and industry standard suggests that crossover frequency points should be approximately one octave above Fs. Unfortunately, operating the tweeter that close to Fs with any order slope causes problems and excites the tweeter, similar to that with the mid/bass.

Once good smooth frequency response has been achieved with the tweeter, good integration with the mid/bass can be realized and the combined frequency response curve of the crossover system will operate such that the drivers will begin to beat together smoothly. The wide frequency gap, or attenuation dip, between the drivers is being "psychoacoustically plugged" and is drawing open the curtains of the mid range.

Due to the fact that two drivers are smooth and under control of the amplifier, they are "beating together". With the Basilar Membrane of the human ear not having to deal with the two-tone noise generation, distortion and unwanted noise is drastically reduced and we are in fact creating a "Virtual Mid Range Driver".

When two tones of nearly identical pitch are played together, we get an audible modulation or pulsing ('Beating') at the rate of the difference between the two frequencies. If the tones are nearly in time with each other (meaning the frequency difference is small) the beating will be slow. If the pitches (tones) are further apart the beating will be faster. Beating occurs because the two sound waves reinforce each other when their peaks align and they cancel each other when they are out of phase (or step with each other.

This occurs in every multi-driver speaker system within the midrange crossover area. When the speakers/crossover/system is beating correctly:

1. Harmonics are restored and dynamic range becomes wider,
2. Distortion (hash, fuzz, grittiness) is lower,
3. Processing of the sounds becomes easier for the listener,
4. Images become solid,
5. Sound staging becomes realistic and has depth, and
6. Listener fatigue is lower.

Any crossover order higher than first order (6 dB/octave) causes time smear, and loses harmonic detail to complete the signal within the pass band. The so called disadvantage of first order crossovers is that, when implemented, the drivers have to accept a frequency range that is too wide and, consequently, are operated up to two octaves outside their useful range. This causes the common misconception that they exhibit poor power handling characteristics.

By using higher and lower frequency points, instead of the actual crossover point as is traditionally used, the Harmonic Structure of the Signal is preserved. In effect, the system operates similar to a "Band Reject Filter."

When used within the critical mid range frequencies of the 2 kHz through to 6 kHz area, the amplitude of the rejected band may be adjusted by widening or narrowing the "window", thus allowing crucial out-of-band information to be restored to allow the in-band information to remain in tact.

The central basis for the method of the subject invention is the two-way crossover design. The results can be achieved in several ways, but the most common is the following:

First, choose a woofer corner frequency based upon the performance of the particular driver. The corner frequency is determined based on the area where the driver operates as close as possible to a flat frequency response. The corner frequency is chosen so as not to occur in the extreme region of driver performance, where the driver starts to reach its mechanical limitations. This frequency range is typically in the range of 550 Hz to 850 Hz. This point is far lower than what is typically used in the industry for a two way configuration, i.e., the actual crossover frequency. However, these values can change depending on how a driver is engineered and where its ideal frequency response occurs.

Figure 3:
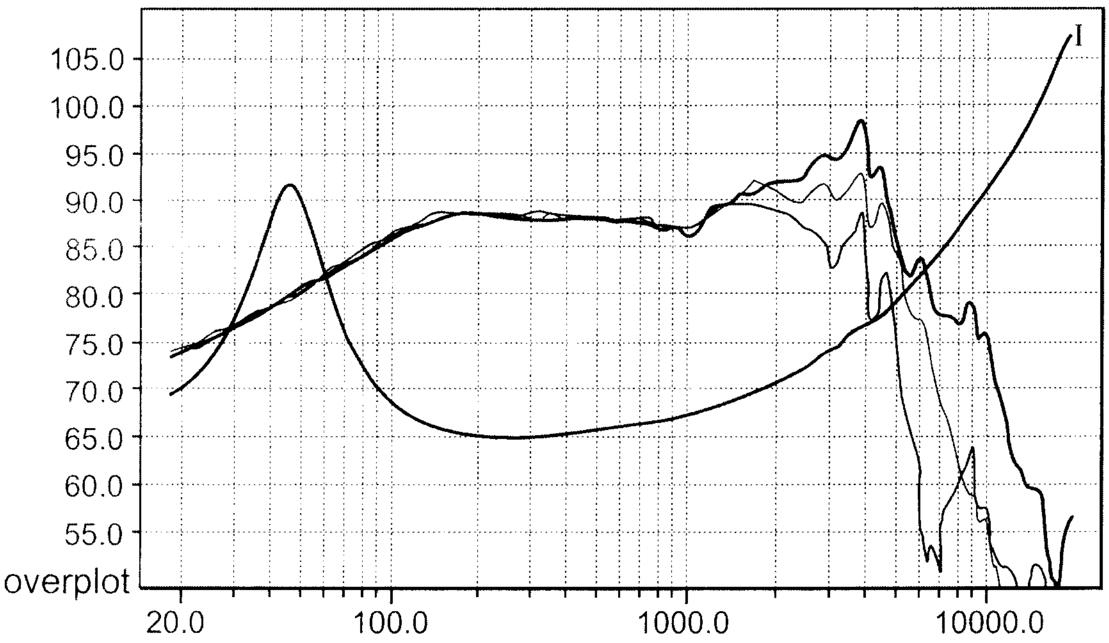
FIG. 3 is a graph showing frequency response of a typical woofer.

As can be seen in the typical 6.5" woofer frequency response graph in FIG. 3, the area above 1 kHz experiences artifacts and mechanical breakup, where the driver becomes non-pistonic and exhibits varying tonal characteristics that add coloring to the input signal. Additionally, from the impedance curve shown on the graph, we can see a drastic increase in impedance of the driver due to voice coil inductance rise.

As can also be seen from the graph in FIG. 3, the area from 550 Hz to 850 Hz is relatively flat and free from any negative effects. Typically a driver of this type used with traditional crossover methods uses a frequency equivalent to the actual crossover point of approximately 2 kHz to 4 kHz, which is well into the problematic area of the driver response.

The designs of the subject invention rely on the fact that drivers are used within their individual pistonic range. Whether tweeter, midrange, or woofer, the idea is to preferably use drivers where their frequency response is ideal, flat, and even. This allows the driver to provide optimum performance with negligible distortion. This also ensures that other artifacts, problems and issues with driver performance and response that are common when using drivers in a wider band of frequency and closer to the maximum of their ideal limits, will not need extra compensation or need to be resolved through additional design and components. The driver behaves and exhibits tremendous control as it is not required to perform anywhere near any of the mechanical breakup that exists on the outer limits of its response curve.

Figure 4:
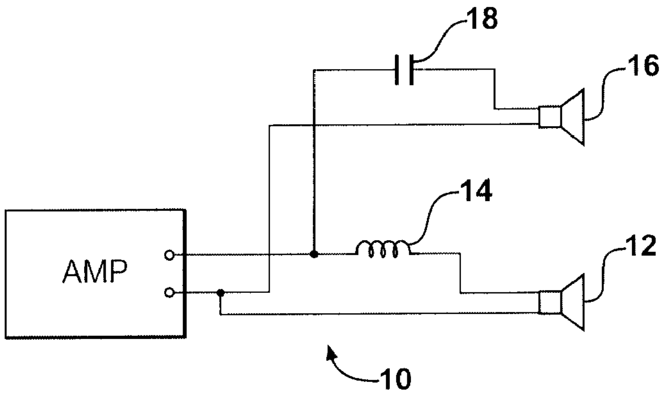
FIG. 4 is a schematic diagram of a crossover system of the subject invention.

Referring to FIG. 4, the passive component value used in the crossover system 10 for the woofer 12 is an inductor 14 and its value is determined based on the standard Butterworth first order formula by using the frequency determined above from the response and impedance of the woofer. This frequency, as previously stated will ideally be between 550 Hz and 850 Hz depending on driver characteristics.

An example follows below using a driver impedance of 8 ohms and a corner frequency point of 850 Hz:

L=inductance value in millihenrys (mH)

Zl=woofer impedance in ohms

Pi (π)=mathematical numerical constant (3.1416 . . . )

fl=corner frequency for the low frequency driver (woofer)

$L=Zl/[(pi\times2)\times fl]$ $L=8/(6.28\times850)=1.498689\ mH\approx1.5\ mH$

This method differs significantly from typical designs in that the corner frequency is far lower than the actual crossover point, which is considered normal within the industry. However, the biggest difference between the method of the subject invention and other crossover designs is the fact that in traditional use of a crossover design and the Butterworth first order formula, there is one frequency point only—the crossover frequency—and it used both in the formula for the inductor and in the formula for the capacitor 18. The capacitor 18 is used with the high frequency driver (tweeter) 16.

Therefore, the biggest difference between the crossover method of the subject invention and traditional methods is the fact there are two separate and distinctive frequency points (i.e., the corner frequencies) used to determine the appropriate driver circuits, one for the woofer 12 and one for the tweeter 16, and that these two corner frequencies are distanced from each other. This distance or frequency spacing is ideally four octaves wide; however it can be at varying distance and is based on a multiplier (the crossover multiplier described below) of the initial crossover frequency of the woofer 12.

Therefore using our example above, the capacitor value of the capacitor 18 for our high frequency driver (tweeter) 16 based on our woofer corner frequency is calculated as follows:

C=capacitance value in microfarads (uF)

Zh=tweeter impedance in ohms fl=corner frequency for the low frequency driver (woofer)

cm=crossover multiplier (in this example, cm=16)

$C=0.159/[Zh\times(fl\times cm)]$ $C=0.159/[8\times850\times16]=1.4614\ uF\approx1.5\ uF$ Inversely, the corner frequencies can also be calculated opposite from our description above by calculating the tweeter frequency first and then applying the formulas in reverse so as to determine the woofer corner frequency.

This attenuation dip or crossover gap between the two corner frequencies can occur at any point within the audible frequency band, and can slide up or down the band from 20 Hz to 20 kHz based on driver characteristics and desired results.

Although the example above is calculated based on a first order design, which is considered optimal, the desired results can be achieved with other variations and orders of crossover when the frequency gap is calculated correctly. This "gaping" method is unique to the method of the subject invention of providing two separate corner frequencies for a two way design, three separate corner frequencies for a three-way design, etc.

Figure 5:
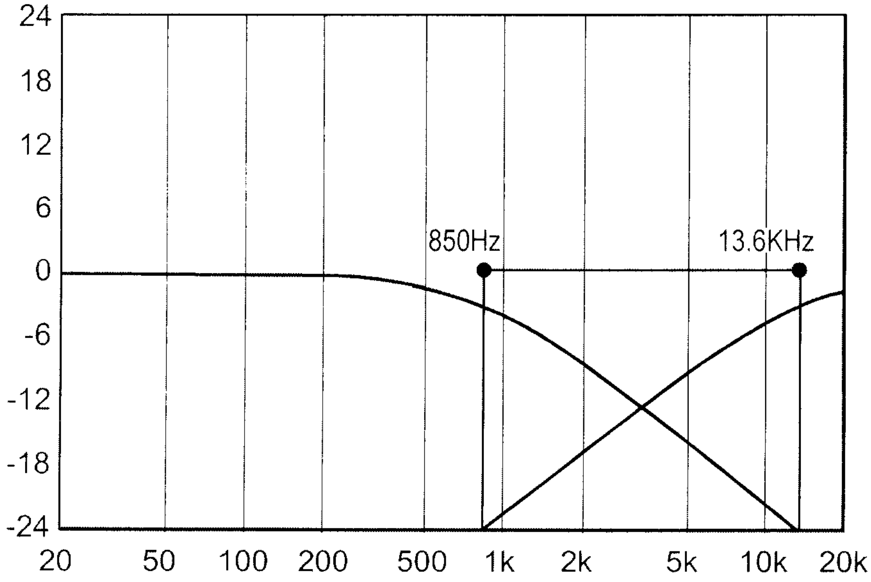
FIG. 5 is a graph showing frequency response of a tweeter and woofer as implemented by the crossover system and method of the subject invention.

When using the Butterworth first order method as a basis for calculating the corner frequencies in the method of the subject invention, it becomes apparent from FIG. 5, that the slow 6 dB/octave slope when used with the ideal cm (crossover multiplier) value of 16 (four octaves) becomes a symmetrical configuration, where the two frequency response curves cross at −12 dB and then at −24 dB are symmetrically aligned with the corner frequencies. This "beating zone" where these parameters align is considered the "ideal" configuration. However, the crossover multiplier can be of varying value depending on the desired characteristic required from the system.

The subject invention shows that the traditional and commonly accepted practice of "tuning" or adjusting speaker systems to have a typical 20 Hz to 20 kHz frequency response as close to flat as possible is, in fact, not optimal, and the ideal response should have a noticeable attenuation dip in the response curve between the two corner frequencies.

The tweeter and midrange point in a three-way system is calculated exactly as with a two-way system with two separate widely spaced corner frequencies. In addition a negative band-pass filter based on the lower frequency of the midrange is calculated and the woofer will always share the same inductor as is used on the lower portion of the midrange driver.

Obviously, many modifications and variations of the present invention are possible in light of the above teachings. The invention may be practiced otherwise than as specifically described within the scope of the appended claims.

What is claimed is:

1. An audio crossover system, comprising:

a first driver circuit, a first speaker operably coupled to said first driver circuit, a second driver circuit, and a second speaker operably coupled to said second driver circuit, wherein said first and second driver circuits combine to create a combined frequency response curve of said audio crossover system that comprises an attenuation dip proximate an actual crossover point of a first frequency response curve of said first driver circuit and a second frequency response curve of said second driver circuit, said first and second driver circuits are determined using respective first and second corner frequencies, which frequencies are distanced from each other based on a crossover multiplier value, and wherein each of said first and second driver circuits has a frequency response curve with a slope of no greater than six decibels per octave between said first and second corner frequencies.

2. The audio crossover system of claim 1, wherein said first speaker comprises a woofer.

3. The audio crossover system of claim 1, wherein said second speaker comprises a tweeter.

4. The audio crossover system of claim 1, wherein said attenuation dip is present substantially between said first and second corner frequencies.

5. The audio crossover system of claim 4, wherein said first corner frequency comprises a point at which said first frequency response curve of said first driver circuit is attenuated approximately 3dB.

6. The audio crossover system of claim 4, wherein said second corner frequency comprises a point at which said second frequency response curve of said second driver circuit is attenuated approximately 3dB.

7. The audio crossover system of claim 4, wherein second corner frequency is approximately 16 times said first corner frequency.

8. The audio crossover system of claim 7, wherein said actual crossover point of said combined frequency response curve of said audio crossover system is approximately 4 times said first corner frequency.

9. The audio crossover system of claim 4, wherein said first driver circuit comprises an inductor, said inductor having an inductance ("L") determined by the equation:

$$L=Zl/[(\pi\times 2)\times fl]$$

where:

Zl =first speaker impedance in ohms, π=Pi, mathematical numerical constant (~3.1416. . .), and fl =said first corner frequency.

10. The audio crossover system of claim 4, wherein said second driver circuit comprises a capacitor, said capacitor having a capacitance ("C") determined by the equation:

$$C=0.159/[Zh\times(fl\times cm)]$$

where:

Zh =second speaker impedance in ohms, fl =said first corner frequency, and cm =a crossover multiplier.

11. A method for providing crossover in an audio system, comprising the steps of:

providing a first driver circuit, wherein said first driver circuit filters an output of said audio system to obtain a first speaker output, providing a second driver circuit, wherein said second driver circuit filters said output of said audio system to obtain a second speaker output, providing said first speaker output to a first speaker, and providing said second speaker output to a second speaker, wherein said first and second speaker outputs combine to create a combined frequency response curve of said audio system that comprises an attenuation dip proximate an actual crossover point of a first frequency response curve of said first driver circuit and a second frequency response curve of said second driver circuit, said first and second driver circuits are determined using respective first and second corner frequencies, which frequencies are distanced from each other based on a crossover multiplier value, and wherein each of said first and second speaker outputs has a frequency response curve with a slope of no greater than six decibels per octave between said first and second corner frequencies.

12. The method of claim 11, wherein said first speaker comprises a woofer.

13. The method of claim 11, wherein said second speaker comprises a tweeter.

14. The method of claim 11, wherein said attenuation dip is present substantially between said first and second corner frequencies.

15. The method of claim 14, wherein said first corner frequency comprises a point at which said first frequency response curve of said first driver circuit is attenuated approximately 3dB.

16. The method of claim 14, wherein said second corner frequency comprises a point at which said second frequency response curve of said second driver circuit is attenuated approximately 3dB.

17. The method of claim 14, wherein second corner frequency is approximately 16 times said first corner frequency.

18. The method of claim 17, wherein said actual crossover point of said combined frequency response curve of said audio system is approximately 4 times said first corner frequency.

19. The method of claim 14, wherein said first driver circuit comprises an inductor, said inductor having an inductance ("L") determined by the equation:

$$L=Zl/[(\pi\times 2)\times fl]$$

where:

Zl =first speaker impedance in ohms,

π=Pi, mathematical numerical constant (~3.1416. . .), and fl =said first corner frequency.

20. The method of claim 14, wherein said second driver circuit comprises a capacitor, said capacitor having a capacitance ("C") determined by the equation:

$$C=0.159/[Zh\times(fl\times cm)]$$

where:

Zh =second speaker impedance in ohms, fl =said first corner frequency, and cm =a crossover multiplier.

* * * * *